United States Patent [19]

Lammerts et al.

[11] Patent Number: 5,014,244

[45] Date of Patent: May 7, 1991

[54] INTEGRATED MEMORY CIRCUIT WITH PARALLEL AND SERIAL INPUT AND OUTPUT

[75] Inventors: Judocus A. M. Lammerts, Eindhoven, Netherlands; Richard C. Foss, Kanata, Canada; Roelof H. W. Salters, Eindhoven, Netherlands

[73] Assignee: U.S. Philips Corp., New York, N.Y.

[21] Appl. No.: 398,816

[22] Filed: Aug. 25, 1989

[30] Foreign Application Priority Data

Aug. 29, 1988 [NL] Netherlands .................. 8802125

[51] Int. Cl.$^5$ .............................................. G11C 7/06
[52] U.S. Cl. ........................... 365/189.05; 365/189.09; 365/189.12; 365/154; 365/219; 307/445; 307/585; 377/69; 377/75; 377/77
[58] Field of Search ............ 365/78, 154, 219, 189.05, 365/189.09, 189.12; 307/445, 585; 377/69, 75, 77

[56] References Cited

U.S. PATENT DOCUMENTS

| | | | |
|---|---|---|---|
| 4,445,201 | 4/1984 | Pricer | 365/154 |
| 4,646,270 | 2/1987 | Voss | 365/189.12 |
| 4,710,649 | 12/1987 | Lewis | 307/585 |
| 4,723,228 | 2/1988 | Shah et al. | 365/189.05 |
| 4,769,789 | 9/1988 | Noguchi et al. | 365/219 |
| 4,773,045 | 9/1988 | Ogawa | 365/78 |
| 4,795,557 | 5/1988 | Ogawa et al. | 365/78 |
| 4,839,868 | 6/1989 | Sato et al. | 365/189.05 |
| 4,897,816 | 1/1990 | Kogan | 365/189.05 |

*Primary Examiner*—Joseph E. Clawson, Jr.
*Attorney, Agent, or Firm*—Steven R. Biren

[57] ABSTRACT

An integrated memory circuit in which memory cells are arranged in rows and columns, each column having a separate sense amplifier. The memory columns can be coupled to neighboring memory columns by additional transistors and the gain of the sense amplifiers in the even and the odd columns is adjustable. Consequently, information can also be serially shifted from one column to another, so that the information can be written and read not only in parallel but also serially.

13 Claims, 3 Drawing Sheets

INTEGRATED MEMORY CIRCUIT WITH PARALLEL AND SERIAL INPUT AND OUTPUT

BACKGROUND OF THE INVENTION

The invention relates to an integrated memory circuit, comprising a matrix in which each column comprises its own sense amplifier circuit for forming an externally presentable output signal on a respective sense amplifier circuit output.

A circuit of the general kind set forth above is known from U.S. Pat. No. 3,930,239.

Said patent specification describes an integrated memory circuit in which the use of an additional shift register enables fast serial writing and reading of data in the memory. Such a memory circuit has the drawback that a large chip surface area is required for the additional on-chip shift register.

SUMMARY OF THE INVENTION

It is inter alia an object of the invention to provide an integrated memory circuit in which data can be quickly written or read, serially or in parallel at option, in or from the memory, but which does not require an additional shift register, allowing the chip surface area of the integrated memory circuit to remain small.

To achieve this, an integrated memory circuit in accordance with the invention is characterized in that each sense amplifier circuit has a latch function, and that there are provided selection means for selecting a number of sense amplifier circuits, each of which forms part of a respective pair of sense amplifier circuits, there also being provided transfer means for directly replacing information of one sense amplifier circuit within the relevant pair by information of the other sense amplifier circuit within the relevant pair, the information of said one sense amplifier circuit thus being destroyed. Said transfer means enable information to or from a memory cell to be applied directly to or transferred directly from an adjacent column. Information can be transported from one column to another so that the information is available in any desired column. Moreover, information can at option be written in or read from the memory in parallel. The memory of the integrated circuit can then be programmed serially, via only one input terminal connected to the chip, by way of externally supplied data. Subsequently, an on-chip microprocessor of the integrated circuit can read the data (for example, instructions which may consist of several bits) from the memory in parallel.

An integrated memory circuit in accordance with the invention offers the advantage that the sense amplifier circuits and the additional switching elements required can be used as a shift register, so that the sense amplifiers have a dual function. The additional switching elements need substantially less chip surface area than the shift register used in the cited reference, so that the total surface area of the integrated memory circuit is smaller.

An embodiment of an integrated memory circuit in accordance with the invention is characterized in that, the one and the other sense amplifier circuit within the pair are directly adjacent, the gain of the one sense amplifier circuit being higher than or equal to the gain of the other sense amplifier circuit under the influence of a control signal. The direction of information transfer from an $n^{th}$ column to an $(n+1)^{th}$ column, or vice versa from the $(n+1)^{th}$ column to the $n^{th}$ column, depends on the respective gains of the sense amplifier circuits in the relevant columns. The information transfer takes place from the column in which the sense amplifier circuit has a higher gain to the column in which the sense amplifier circuit has a lower gain, so that the direction of information transfer is defined. Because the sense amplifier circuits within a pair are directly adjacent, only a small chip surface area will be required for the connections between the sense amplifier circuits.

A preferred embodiment of an integrated memory circuit in accordance with the invention is characterized in that the sense amplifier circuits comprise combined inputs and outputs. As a result, a typical flip-flop figuration is obtained where a flip-flop in a column has a master function and a flip-flop in a neighboring column has a slave function. Without using additional switching means, it is thus possible to write information serially into the memory cells in addition to the serial reading of information from the memory cells.

The invention also relates to an integrated circuit, comprising a processor, a data bus and a memory circuit, the processor being connected, via the data bus, to parallel inputs and outputs of the memory circuit in accordance with the invention. Thus, any programming of the processor (having, for example an instruction word width of 32 bits) requires only a single connection pin of the integrated circuit (contrary to the 32 connection pins required for parallel programming), resulting in a compact casing for the integrated circuit.

BRIEF DESCRIPTION OF THE DRAWINGS

The invention will be described in detail hereinafter with reference to the drawing; therein.

DESCRIPTION OF THE PREFERRED EMBODIMENTS

Figure 1:
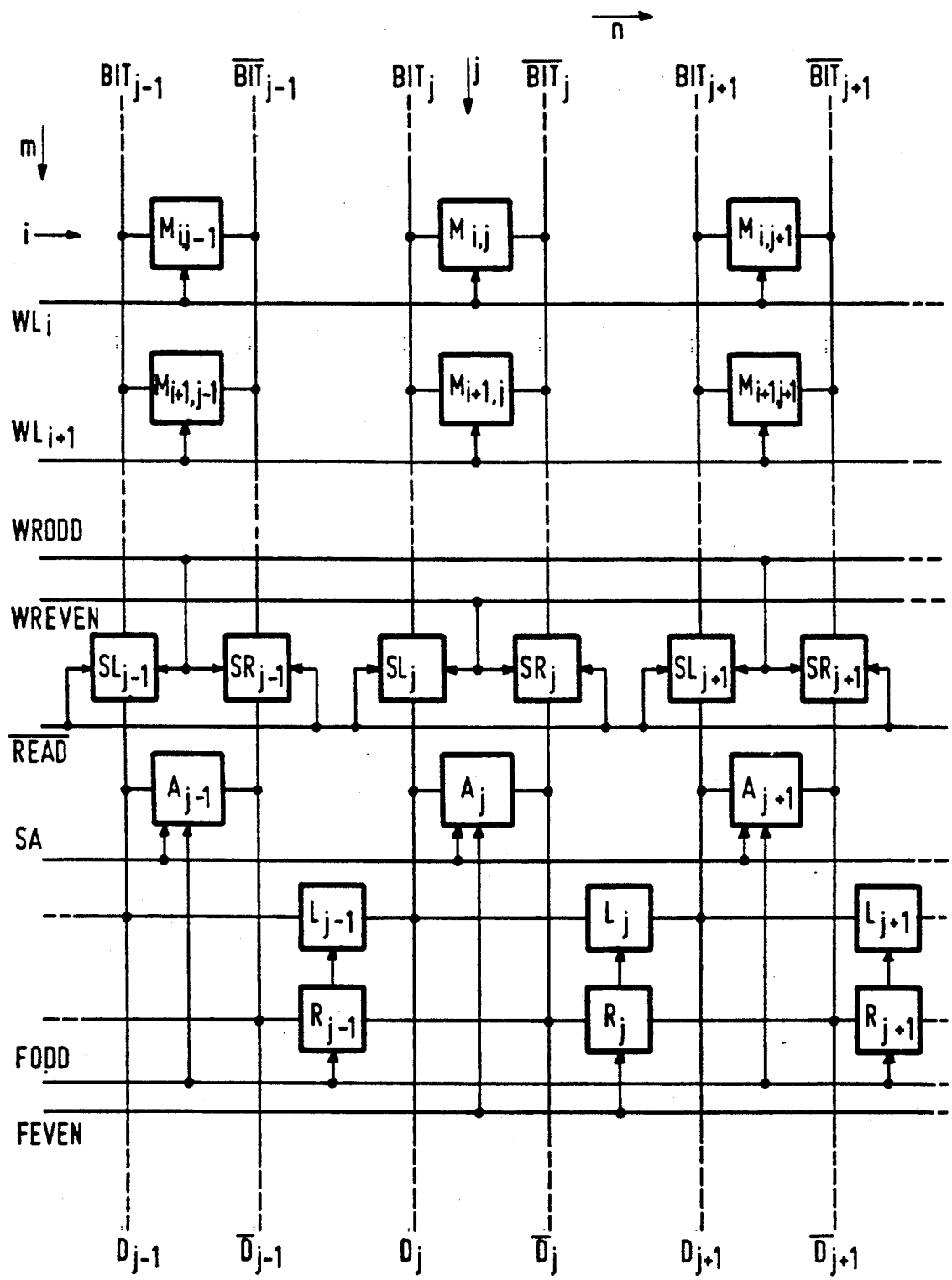
FIG. 1 shows a memory circuit in accordance with the invention.

FIG. 1 shows a part of a memory circuit in accordance with the invention. The memory circuit comprises:

a matrix of memory cells $M_{i,j}$ which are arranged in m rows and n columns, m and n being the number of rows and the number of columns, respectively, which memory cells $M_{i,j}$ in a column j (in this example j is even) are interconnected via two bit lines ($BIT_j$ and $\overline{BIT}_j$), all memory cells in the same row i receiving a row selection signal $WL_i$, in each column j a sense amplifier circuit $A_j$ comprising combined inputs and outputs, all sense amplifier circuits $A_j$ receiving a common control signal via an amplifier control line SA, the sense amplifier circuits in the odd columns and the even columns also receiving a control signal via a first selection line FODD and a second selection line FEVEN, respectively, for each column j switchable cascode elements $SL_j$ and $SR_j$, respectively, which couple the combined inputs and outputs of the sense amplifier circuit $A_j$, connected to a data line $D_j$ and $\overline{D}_j$, respectively, and in a column j to the bit line $BIT_j$ and $\overline{BIT}_j$, respectively, which elements $SL_j$ and $SR_j$ are connected in all columns j to a common read control line $\overline{READ}$ and, in the odd $(1, \ldots, j-1, j+1, \ldots)$ even $(2, \ldots, j, j+2, \ldots)$ columns, are also connected to a first write line WRODD and a second write line WREVEN, respectively, switching elements L and R which are capable of connecting, for two neighboring columns j and j+1, the data line $D_j$ to $D_{j+1}$ and $\overline{D}_j$ to $\overline{D}_{j+1}$, the elements $L_j$ and $R_j$ connecting the column j to the adjacent column j+1 by supplying a control signal on the second selection line FEVEN, elements $L_{j-1}$ and $R_{j-1}$ connecting an odd column j−1 to an even column j by way of a control signal on the first selection line FODD.

Hereinafter, signals which must be logic low or logic high will be referred to as "low" and "high", respectively.

The operation of the part of the memory circuit shown in FIG. 1 will be described successively for the reading of information from and the writing of information into the memory cells $M_{i,j}$.

In order to read information from a row of memory cells $M_{i,j}$, the following control signals assume the following logic levels: the control signal on the word line $WL_i$ becomes "high" so that all memory cells $M_{i,j}$ in the row i are selected. As a result, logic signals appear on all bit lines BIT and $\overline{BIT}$. The control signal on the read control line $\overline{READ}$ subsequently becomes "low", so that the cascode elements $SL_{j-1}$, $SR_{j-1}$, $SL_j$, $SR_j$, $SL_{j+1}$, $SR_{j+1}$ etc. in all columns 1, 2, ..., j, ..., n connect the bit lines $BIT_j$ and $\overline{BIT}_j$ to the sense amplifier circuit $A_j$ and the data lines $D_j$ and $\overline{D}_j$, respectively. When subsequently a "high" control signal appears on the amplifier control line SA, each sense amplifier circuit $A_j$ takes over the information presented on the bit lines $BIT_j$ and $\overline{BIT}_j$ and the data lines $D_j$ and $\overline{D}_j$, amplifies these signals and retains them for the time being.

The information available on the outputs of each sense amplifier circuit $A_j$ and the data lines $D_j$ and $\overline{D}_j$ can subsequently be transferred in parallel to other circuits which are not shown in the drawing, for example to an on-chip micro-processor.

However, it is also possible to transfer the information present on the outputs of each sense amplifier circuit $A_j$ after the reading of a row i of memory cells $M_{i,j}$ serially instead of in parallel to circuits (not shown) in the integrated memory circuit, for example a microprocessor. The serial presentation of information in accordance with the invention is realized as follows: the data lines $D_j$ and $\overline{D}_j$ in a column j are connected, via switching elements $L_j$ and $R_j$, to the data lines $D_{j+1}$ and $\overline{D}_{j+1}$ in a directly adjacent column j+1. The drawing shows that switching elements $L_{j-1}$ and $R_{j-1}$ connect the data lines $D_{j-1}$ and $\overline{D}_{j-1}$, respectively, in the column j−1 to the data lines $D_j$ and $\overline{D}_j$, respectively, in the column j, and that switching elements $L_j$ and $R_j$ connect the data lines $D_j$ and $\overline{D}_j$, respectively, in the column j to the data lines $D_{j+1}$ and $\overline{D}_{j+1}$, respectively, in the column j+1. When the switching elements $L_{j-1}$ and $R_{j-1}$, $L_{j+1}$ and $R_{j+1}$ etc. are selected by a "high" selection signal on the line FODD, while the switching elements $L_j$ and $R_j$, $L_{j+2}$ and $R_{j+2}$ (not shown in the drawing) etc. are not selected because of a "low" signal on the line FEVEN, information can flow from the column j−1 to the column j or vice versa from the column j to the column j−1. Similarly, information can flow from the column j+1 to the column j+2 or vice versa from the column j+2 to the column j+1, etc. The direction of information transfer, from a column j to a column j+1 or vice versa from a column j to a column j−1, depends on the gains of the sense amplifier circuits $A_{j-1}$, $A_j$, $A_{j+1}$, $A_{j+2}$ in the relevant columns j−1, j, j+1, j+2. The control signal on the amplifier control line SA is "high" during the serial transfer, so that a sense amplifier circuit receiving information from a neighboring sense amplifier circuit can take over and retain this information. The information transfer takes place from a column with a sense amplifier circuit of higher gain to a column comprising a sense amplifier circuit of lower gain, the information in the latter column being lost because the information originally present therein is replaced by new information from the adjacent column in which the gain of the sense amplifier circuit is higher.

The required discrimination between the gains of the sense amplifier circuits is also realized by means of the signals on the selection lines FODD and FEVEN. In the presence of a selection signal on the line FODD and absence of a selection signal on the line FEVEN, the gain of, for example the sense amplifier circuit $A_{j-1}$ is higher than the gain of the sense amplifier circuit $A_j$. Because in FIG. 1 the sense amplifier circuits $A_{j-1}$, $A_{j+1}$, etc. and the switching elements $L_{j-1}$ and $R_{j-1}$, $L_{j+1}$ and $R_{j+1}$, etc. all receive a control signal via the line FODD, and the sense amplifier circuits $A_j$, $A_{j+2}$ etc. and the switching elements $L_j$ and $R_j$, $L_{j+2}$ and $R_{j+2}$ etc. all receive a control signal via the line FEVEN, the information transfer takes place from the column j to a column j+1. When the drive of the sense amplifier circuits $A_j$ and $A_{j-1}$ is reversed (replacing each drive via the lines FODD and FEVEN by a drive via the line FEVEN and FODD, respectively) and the drive for the switching elements $L_j$ and $R_j$ remains the same, or when the drive of the switching elements $L_j$, $R_j$ and $L_{j-1}$ $R_{j-1}$ is reversed and the drive of the sense amplifier circuits $A_j$ remains the same, the latter direction of information transfer is reversed and information is transferred from a column j to a column j−1. However, addition of simple multiplex circuits and a control signal to be applied thereto enable the information transfer to take place as desired from the column j to the column j+1 or from the column j to the column j−1. The additional control signal makes the multiplexer circuits connect the sense amplifier circuits $A_j$, $A_{j+2}$ etc. to either the line FODD or the line FEVEN, and the sense amplifier circuits $A_{j-1}$ and $A_{j+1}$ to either the line FEVEN or the line FODD. In the former case, the information transfer takes place from right to left and in the second case from left to right. For the sake of simplicity, hereinafter a signal on a line will be denoted by the symbol of the relevant line.

For serial transfer of information to circuits (not shown) in the integrated memory circuit, control signals FODD and FEVEN assume the following levels, viewed in time: control signal SA is "high", control signal FODD is "high" and control signal FEVEN is "low", so that information transfer takes place from the column j−1 to the column j, from the column j+1 to the column j+2 etc. Subsequently, the control signal FODD becomes "low" and the control signal FEVEN becomes "high", so that information transfer takes place from the column j to the column j+1, from the column j+2 to the column j+3 etc. The control signal FODD becomes "high" again and the control signal FEVEN becomes "low" again, so that a data transfer takes place to a next column, etc. The control signals FODD and FEVEN alternately become "high" and "low" until all desired information has been transferred to circuits (not shown) in the integrated memory circuit. The described sequence of control signals FODD and FEVEN ensures the presentation of the memory information in the odd columns j−1, j+1, etc., via the last column n in the memory circuit, to circuits (not shown) in the integrated memory circuit. Using a sequence of control signals FODD and FEVEN which is similar to the one described above, be it with an initial value of FODD and FEVEN which, after the memory information has become available on all combined inputs and outputs of the sense amplifier circuits $A_j$, is "low" and "high", respectively, the information is presented from the even columns j, j+2, etc. to circuits (not shown) in the integrated memory circuits. The serial reading of a full row of memory cells $M_{i,j}$ should, therefore, take place in two steps, i.e. serial reading of the odd columns j−1, j+1 etc., followed by the reading of the even columns j, j+2 etc., or the reading of the even columns, followed by the odd columns of the memory circuit.

The writing of information in a row i of memory cells $M_{i,j}$ can also be realized in two different ways as already described for the reading of information from the memory cells, i.e. in parallel or serially. In the case of parallel presentation of information on the data lines $D_j$ and $\overline{D}_j$, this information is taken over and retained in the presence of a "high" control signal SA. Subsequently, in the presence of "high" signals WRODD, WREVEN and $WL_i$ this information is stored in the memory cells $M_{i,j}$ in the row i. Alternatively, information can be stored in the memory cells $M_{i,j}$ by means of other drivers (not shown in FIG. 1) coupled to the data lines $D_{j-1}$ and $\overline{D}_{j-1}$, $D_j$ and $\overline{D}_j$, $D_{j+1}$ and $\overline{D}_{j+1}$ etc. instead of by means of sense amplifier circuits $A_{j-1}$, $A_j$, $A_{j+1}$ etc. In the present example the serial writing of information in a row of memory cells is performed as follows: information is presented to the data lines $D_1$ and $\overline{D}_1$ of the first column 1 in the memory circuit. The control signal SA is "high". Subsequently, the control signal FODD becomes "high" and the control signal FEVEN remains "low". Consequently, the sense amplifier circuit $A_2$ in the adjacent second column 2 takes over this information. Subsequently, the control signal FEVEN becomes "high" and FODD becomes "low", so that this information is taken over by the sense amplifier circuit $A_3$ in the third column 3. Subsequently, new information is presented to the data lines $D_1$ and $\overline{D}_1$ of the first memory column 1, after which the control signal FODD becomes "high" and FEVEN becomes "low" again etc. Thus, information is serially shifted from the column j to the column j+1. Like in the preceding description of the serial reading of memory cells, the serial writing of information in a row of memory cells must also take place in two steps. During the first step, writing takes place, for example in the $i^{th}$ row in the memory cells in the odd columns and in a second step in the memory cells in the even columns or vice versa. Using the control signals WRODD and WREVEN, driving the cascode elements SL and SR, the information shifted to the sense amplifier circuits during the first and the second step, respectively, can be written in the memory cells of the odd and the even columns, respectively, or of the even and the odd columns, respectively.

Figure 2:
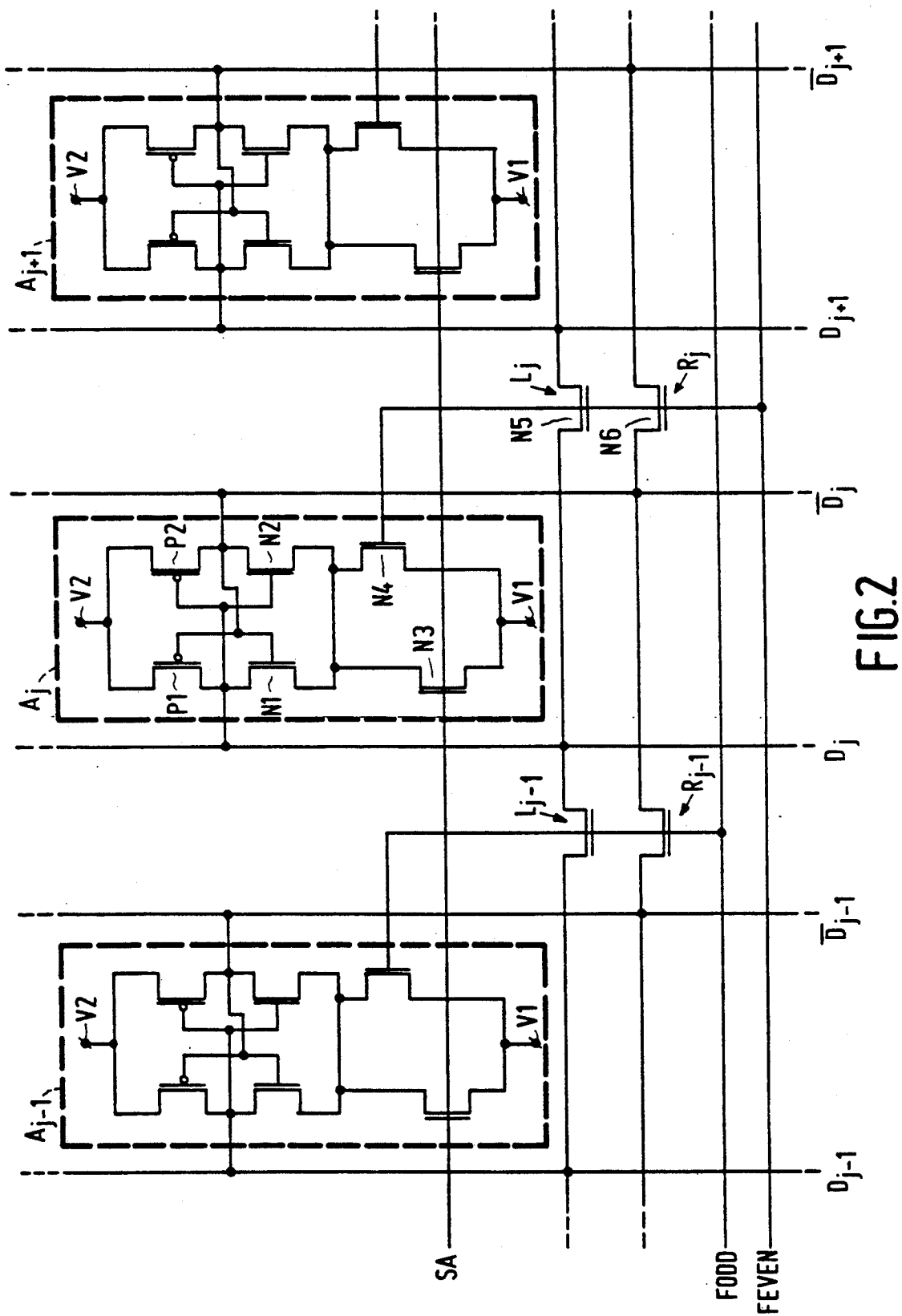
FIG. 2 is a detailed representation of a preferred embodiment of a part of the memory circuit shown in FIG. 1.

FIG. 2 is a detailed representation of a preferred embodiment of a part of the memory circuit shown in FIG. 1, that is to say a preferred embodiment of the switching elements $L_{j-1}$ and $R_{j-1}$, $L_j$ and $R_j$ etc. and the sense amplifier circuits $A_{j-1}$, $A_j$, $A_{j+1}$ etc. The switching elements $L_{j-1}$ and $R_{j-1}$, $L_j$ and $R_j$ etc. each comprise an n-type transistor N5 and N6 and each sense amplifier circuit A comprises four n-type transistors N1, N2, N3 and N4, and two p-type transistors P1 and P2. The sources of the transistors N1 and N2 are connected to one another and to the drains of the transistors N3 and N4. The drains of the transistors N1 and P1 and of the transistors N2 and P2 are connected to one another, to the gates of the transistors N2 and P2 and N1 and P1, respectively, and to the data line D and $\overline{D}$, respectively. The sources of the transistors P1 and P2 and of the transistors N3 and N4 are coupled to power supply terminals V2 and V1, respectively. The gate of the transistor N3 and of the transistor N4 in the column j receives a control signal SA and a control signal FEVEN, respectively.

The circuit shown in FIG. 2 operates as follows: in the case of a "high" control signal FEVEN, a "low" control signal FODD and a "high" control signal SA, the transistors N3 and N4 are both turned on and a comparatively large current flows to the first power supply terminal V1. Consequently, the gain of the sense amplifier circuit $A_j$ exceeds that of the sense amplifier circuit $A_{j+1}$ which is driven only by the control signal SA and not by the control signal FODD so that, as has already been mentioned in the description of the operation of the circuit shown in FIG. 1, information is transferred from the column j to the neighboring column j+1.

Figure 3:
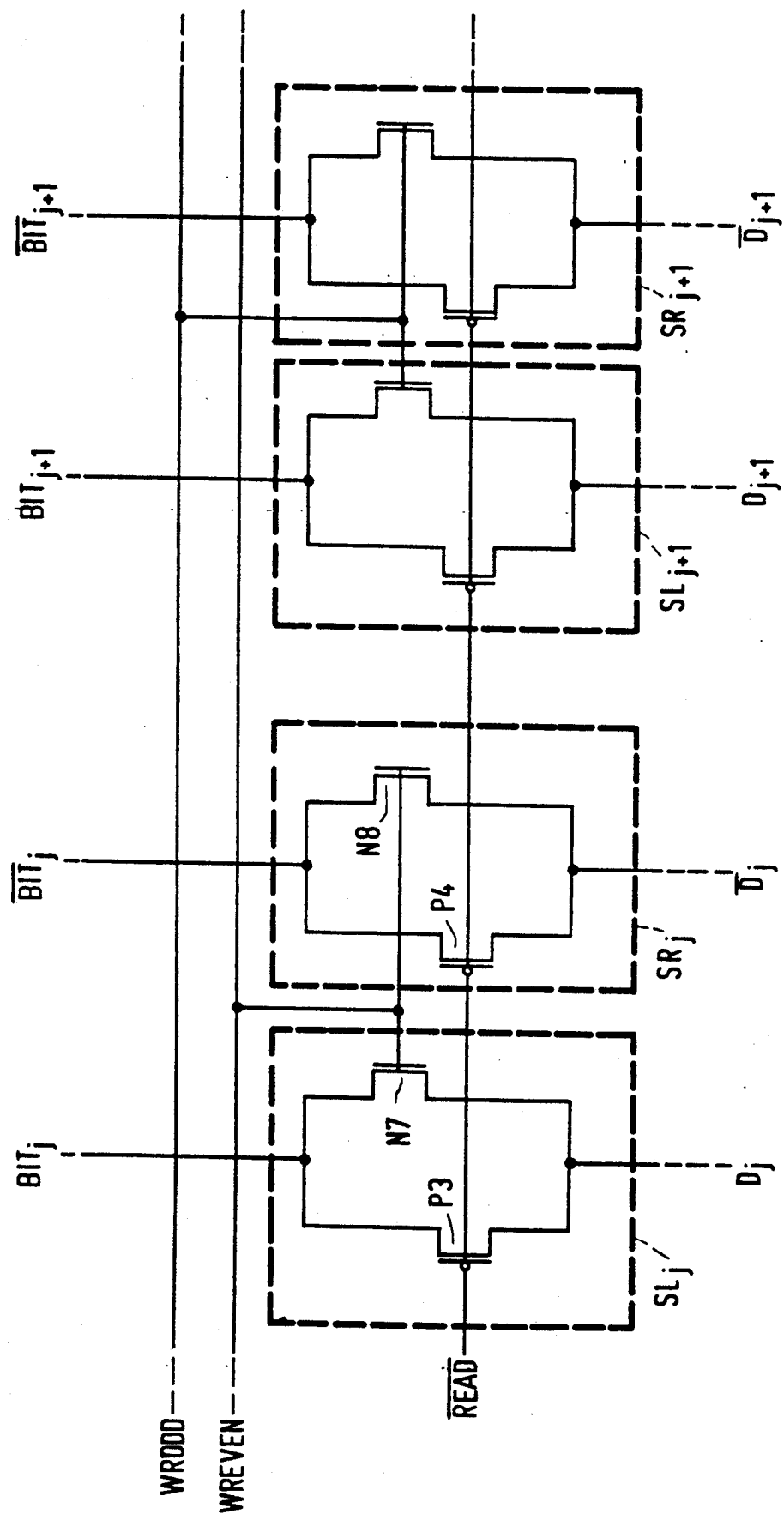
FIG. 3 is a detailed representation of a preferred embodiment of another part of the memory circuit shown in FIG. 1.

FIG. 3 is a detailed representation of a preferred embodiment of the cascode elements $SL_j$ and $SR_j$, $SL_{j+1}$ and $SR_{j+1}$ etc. shown in FIG. 1. Each of the cascode elements SL and SR comprises a parallel connection of an n-type transistor N7 and N8, respectively, and a p-type transistor P3 and P4, respectively. The gates of the transistors N7 and N8 in the even (2, 4, 6, ...) memory columns and the odd (1, 3, 5, ...) memory columns are coupled to control signals WREVEN and WRODD, respectively. The gates of the transistors P3 and P4 in the cascode elements SL and SR in each memory column are controlled by the control signal $\overline{READ}$.

The circuit shown in FIG. 3 operates as follows: the functions of the cascode elements SL and SR have already been described with reference to FIG. 1, so that only the functions of the n-type and p-type transistors will be elucidated. In the case of a "low" control signal $\overline{READ}$, the transistors P3 and P4 in all cascode elements SL and SR in the memory circuit are turned on, so that in each column j the bit line $BIT_j$ is connected to the data line $D_j$ and the bit line $\overline{BIT}_j$ is connected to the data line $\overline{D}_j$. The use of p-type transistors instead of n-type transistors for the transistors P3 and P4 is to be preferred, because the voltages on the bit lines $BIT_j$ and $\overline{BIT}_j$ are usually greater than the sum of the control voltage $\overline{READ}$ plus the threshold voltage $V_{THP}$ of a p-type transistor when information is read from a memory cell $M_{i,j}$ (this sum is approximately equal to 1 V in the case of a supply voltage of, for example 5 V), so that no voltage loss occurs across the transistors P3 and P4. For the transistors N7 and N8 preferably n-type transistors are used, because the transistors which connect the memory cells $M_{i,j}$ to the bit lines $BIT_j$ and $\overline{BIT}_j$ (not shown in the Figure) are usually also n-type transistors, so that in the case of a write operation in the memory cells $M_{i,j}$ via the bit lines $BIT_j$ and $\overline{BIT}_j$ no threshold voltage loss occurs for a "low" level.

We claim:
1. An integrated memory circuit, comprising a matrix having rows and columns in which each column com- prises its own sense amplifier circuit for forming an externally-presentable output signal on a respective sense amplifier circuit output, characterized in that each sense amplifier circuit has a latch function and selection means are provided for selecting a number of sense amplifier circuits, each of which forms part of a respective pair of sense amplifier circuits, and transfer means for directly replacing information in one sense amplifier circuit within the relevant pair, the information in said one sense amplifier circuit thereby being destroyed.

2. An integrated memory circuit as claimed in claim 1, characterized in that the one and the other sense amplifier circuit within the pair are directly adjacent, the gain of the one sense amplifier circuit being set to a level at least equal to the gain of the other sense amplifier circuit under the influence of a control signal applied to said one sense amplifier circuit.

3. An integrated memory circuit as claimed in claim 1 or 2, characterized in that the sense amplifier circuits comprise combined inputs and outputs.

4. An integrated memory circuit as claimed in claim 1 or 2, characterized in that each input of a sense amplifier circuit in a column is connected to a bit line in the relevant column via a separately-switchable cascode element which is suitable for the reception of two different control signals.

5. An integrated memory circuit as claimed in claim 1 or 2, characterized in that each switchable series element comprises an n-type transistor.

6. An integrated memory circuit as claimed in claim 4, characterized in that each switchable cascode element comprises a parallel connection of a p-type transistor and an n-type transistor.

7. An integrated memory circuit as claimed in claim 5, characterized in that control electrodes of the n-type transistors, from an odd to an even column bearing an increasing column number, are suitable for the reception of a first control signal and, from an even to an odd column bearing an increasing column number, suitable for the reception of a second control signal.

8. An integrated memory circuit as claimed in claim 6, characterized in that the control electrode of the p-type transistor in each switchable cascode element is suitable for the reception of a read signal, the control electrode of the n-type transistor in each switchable cascode element in an odd and an even column being suitable for the reception of a first and a second write signal, respectively.

9. An integrated memory circuit as claimed in claim 7, characterized in that the sense amplifier circuit in an odd and an even column is suitable for the reception of the first and the second control signal, respectively, or the second and the first control signal, respectively.

10. An integrated memory circuit as claimed in claim 9, in which each sense amplifier circuit can be switched on or off by means of an n-type transistor, characterized in that parallel to the latter n-type transistor there is connected an additional n-type transistor whose control electrode is suitable for the reception of the first or the second control signal.

11. An integrated memory circuit as claimed in claim 6, characterized in that said n-type transistor is an n-channel field effect transistor and said p-type transistor is a p-channel field effect transistor.

12. An integrated circuit, comprising a processor, a data bus and a memory circuit, the processor being connected, via the data bus, to parallel inputs and outputs of the memory circuit as claimed in claim 1 or 2.

13. An integrated circuit as claimed in claim 12, characterized in that a serial input/output of the memory circuit is connected to a connection pin of the integrated circuit.

* * * * *